United States Patent
Wu (10) Patent No.: US 8,610,047 B2
(45) Date of Patent: Dec. 17, 2013

(54) IMAGE SENSOR PIXEL HAVING A STATIC TRANSISTOR AND A DYNAMIC TRANSISTOR COUPLED TO A SENSING CAPACITOR AND DRIVING METHOD THEREOF

(75) Inventor: Chih-Hao Wu, Miao-Li County (TW)

(73) Assignee: Chimei Innolux Corporation, Miao-Li County (TW)

( * ) Notice: Subject to any disclaimer, the term of this patent is extended or adjusted under 35 U.S.C. 154(b) by 279 days.

(21) Appl. No.: 13/240,703

(22) Filed: Sep. 22, 2011

(65) Prior Publication Data
US 2012/0235026 A1    Sep. 20, 2012

(30) Foreign Application Priority Data

Mar. 17, 2011   (TW) .............................. 100109215 A (51) Int. Cl.
*H01J 40/14*    (2006.01)
(52) U.S. Cl.
USPC ................................... 250/214 R; 250/208.1

(58) Field of Classification Search
USPC ................ 250/214 R, 208.1, 370.08, 370.09, 250/370.14; 348/302–311; 378/98.8, 19, 378/146; 257/290–292, 440
See application file for complete search history.

(56) References Cited

U.S. PATENT DOCUMENTS 6,452,153 B1 *   9/2002   Lauxtermann et al. .... 250/208.1

* cited by examiner

*Primary Examiner* — Que T Le
(74) *Attorney, Agent, or Firm* — McClure, Qualey & Rodack, LLP (57) ABSTRACT

An image sensor pixel and a driving method thereof are provided. The image sensor pixel comprises a photodiode, a sensing capacitor, a static transistor and a dynamic transistor. A first terminal of the photodiode is coupled to a bias line. A control terminal of the static transistor is coupled to a static gate line, and a first terminal of the static transistor is coupled to a first terminal of the sensing capacitor and a second terminal of the photodiode. A control terminal of the dynamic transistor is coupled to a dynamic gate line, and a first terminal of the dynamic transistor is coupled to a second terminal of the sensing capacitor.

19 Claims, 10 Drawing Sheets

IMAGE SENSOR PIXEL HAVING A STATIC TRANSISTOR AND A DYNAMIC TRANSISTOR COUPLED TO A SENSING CAPACITOR AND DRIVING METHOD THEREOF

This application claims the benefit of Taiwan application Serial No. 100109215, filed Mar. 17, 2011, the subject matter of which is incorporated herein by reference.

BACKGROUND OF THE INVENTION

1. Field of the Invention

The invention relates in general to a pixel, and more particularly to an image sensor pixel and a driving method thereof.

2. Description of the Related Art

Figure 1:
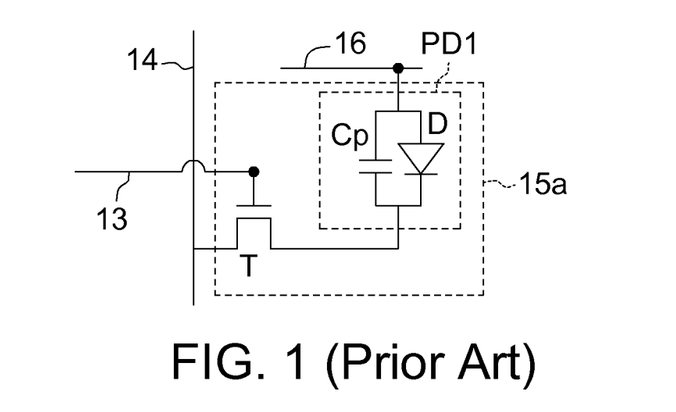
FIG. 1 shows a schematic diagram of first conventional image sensor pixel.

Referring to FIG. 1, a schematic diagram of first conventional image sensor pixel is shown. The conventional image sensor pixel 15a is for sensing an X-ray image. The conventional image sensor pixel 15a comprises a photodiode PD1 and a transistor T. The photodiode PD1, which can be realized by such as a PIN photodiode, comprises a photodiode body D and an equivalent capacitor Cp which are connected in parallel. An anode of the photodiode PD1 is coupled to a bias line 16 which is used for transmitting a bias voltage to an anode of the photodiode PD1, so that the photodiode PD1 is operated in a reverse bias state. A control terminal of the transistor T is coupled to a gate line 13. A first terminal of the transistor T is coupled to a cathode of the photodiode PD1, and a second terminal of the transistor T is coupled to a data line 14.

The transistor T can be realized by such as is thin film transistor (TFT), and the control terminal of the transistor T can be realized by such as a gate. If the current flows to the second terminal of the transistor T from the first terminal of the transistor T, the first terminal and the second terminal of the transistor T are respectively realized by such as a drain or source. To the contrary, if the current flows to the first terminal of the transistor T from the second terminal of the transistor T, the first terminal and the second terminal of the transistor T are respectively realized by such as a source or a drain.

The X-ray is converted into a visible light by a fluorescent layer, then the visible light illuminates the photodiode PD1. After the photodiode PD1 is illuminated by the visible light, the covalent bond is broken and electron hole pairs are generated. The holes move towards the bias line 16, and the electrons are stored in the equivalent capacitor Cp. Then, the electrons stored in the equivalent capacitor Cp are read by the data driving circuit so as to obtain a corresponding image signal.

The capacitance of the equivalent capacitor Cp of the photodiode PD1 equals $\epsilon A/d$, wherein d denotes the distance between an upper electrode and a lower electrode of the equivalent capacitor Cp, A denotes the overlapping area between an upper electrode and a lower electrode of the equivalent capacitor Cp, $\epsilon$ denotes a corresponding dielectric coefficient of the equivalent capacitor Cp. The capacitance of the equivalent capacitor Cp of the photodiode PD1 is subjected to the optical conversion efficiency of the photodiode PD1, and the larger the overlapping area A, the better the optical conversion efficiency. Thus, the capacitance of the equivalent capacitor Cp shall not be too small otherwise the number of electrons outputted by the equivalent capacitor Cp when read by the data driving circuit will be too small. To assure that the number of electrons outputted by the equivalent capacitor Cp is sufficient, the capacitance of the equivalent capacitor Cp must be designed to be large enough. To summarize, the bottleneck of the resistive-capacitive delay (RC Delay) lies in the equivalent capacitor Cp. The resistance of the RC delay refers to the on-state resistance of the transistor T, and the capacitance of the RC delay refers to the equivalent capacitor Cp.

Figure 2:
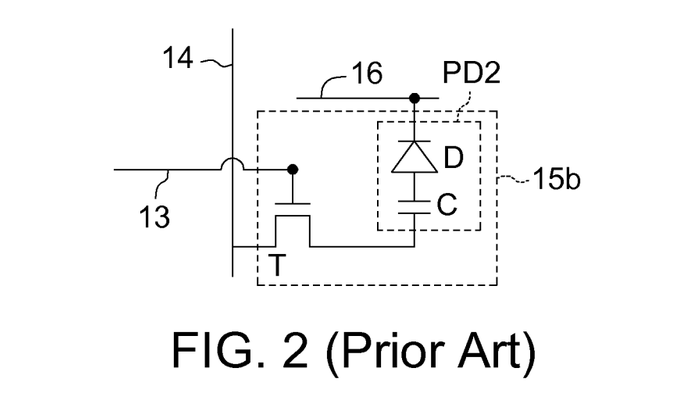
FIG. 2 shows a schematic diagram of second conventional image sensor pixel.

Referring to FIG. 2, a schematic diagram of second conventional image sensor pixel is shown. The conventional image sensor pixel 15b comprises a photodiode PD2 and a transistor T. The photodiode PD2, which can be realized by such as a MIS photodiode, comprises a photodiode body D and an equivalent capacitor C which are connected in serial. A cathode of the photodiode PD2 is coupled to a bias line 16 used for transmitting a bias voltage to a cathode of the photodiode PD2, so that the photodiode PD2 is operated in a reverse bias state. A control terminal of the transistor T is coupled to the gate line 13. A first terminal of the transistor T is coupled to an anode of the photodiode PD2, and a second terminal of the transistor T is coupled to a data line 14. Similarly, the capacitance of the equivalent capacitor C must be designed to be large enough. Thus, the bottleneck of the RC delay lies in the equivalent capacitor C.

To sense a dynamic object, at least 30 frames must be read per second. For the conventional image sensor pixel, the equivalent capacitor Cp or the equivalent capacitor C has a larger capacitance, so the read speed is subjected to the restriction in the RC Delay of the conventional image sensor pixel and the conventional image sensor pixel is thus inapplicable to sensing a dynamic object.

SUMMARY OF THE INVENTION

The invention is directed to an image sensor pixel and a driving method thereof in which the sensing capacitor is serially connected for increasing the read speed when sensing a dynamic object.

According to a first aspect of the present invention, an image sensor pixel is provided. The image sensor pixel comprises a photodiode, a sensing capacitor, a static transistor and a dynamic transistor. A first terminal of the photodiode is coupled to a bias line. A control terminal of the static transistor is coupled to a static gate line, and a first terminal of the static transistor is coupled to a first terminal of the sensing capacitor and a second terminal of the photodiode. A control terminal of the dynamic transistor is coupled to a dynamic gate line, and a first terminal of the dynamic transistor is coupled to a second terminal of the sensing capacitor.

According to a second aspect of the present invention, a driving method of image sensor pixel is provided. The image sensor pixel comprises a photodiode, a sensing capacitor, a static transistor and a dynamic transistor. The driving method comprise the following steps: A static gate line and a dynamic gate line are enabled to initialize the potentials at a first terminal and a second terminal of the sensing capacitor, wherein the static gate line is coupled to a control terminal of the static transistor, the dynamic gate line is coupled to a control terminal of the dynamic transistor, a first terminal of the photodiode is coupled to the bias line, a first terminal of the static transistor is coupled to a first terminal of the sensing capacitor and a second terminal of the photodiode, and a first terminal of the dynamic transistor is coupled to a second terminal of the sensing capacitor. The static gate line and the dynamic gate line are disabled and the photodiode is illuminated. The static gate line is disabled, the dynamic gate line is enabled, and the carriers stored in the photodiode are read through the dynamic transistor and the sensing capacitor.

The above and other aspects of the invention will become better understood with regard to the following detailed description of the preferred but non-limiting embodiment(s). The following description is made with reference to the accompanying drawings.

DETAILED DESCRIPTION OF THE INVENTION

First Embodiment

Figure 3:
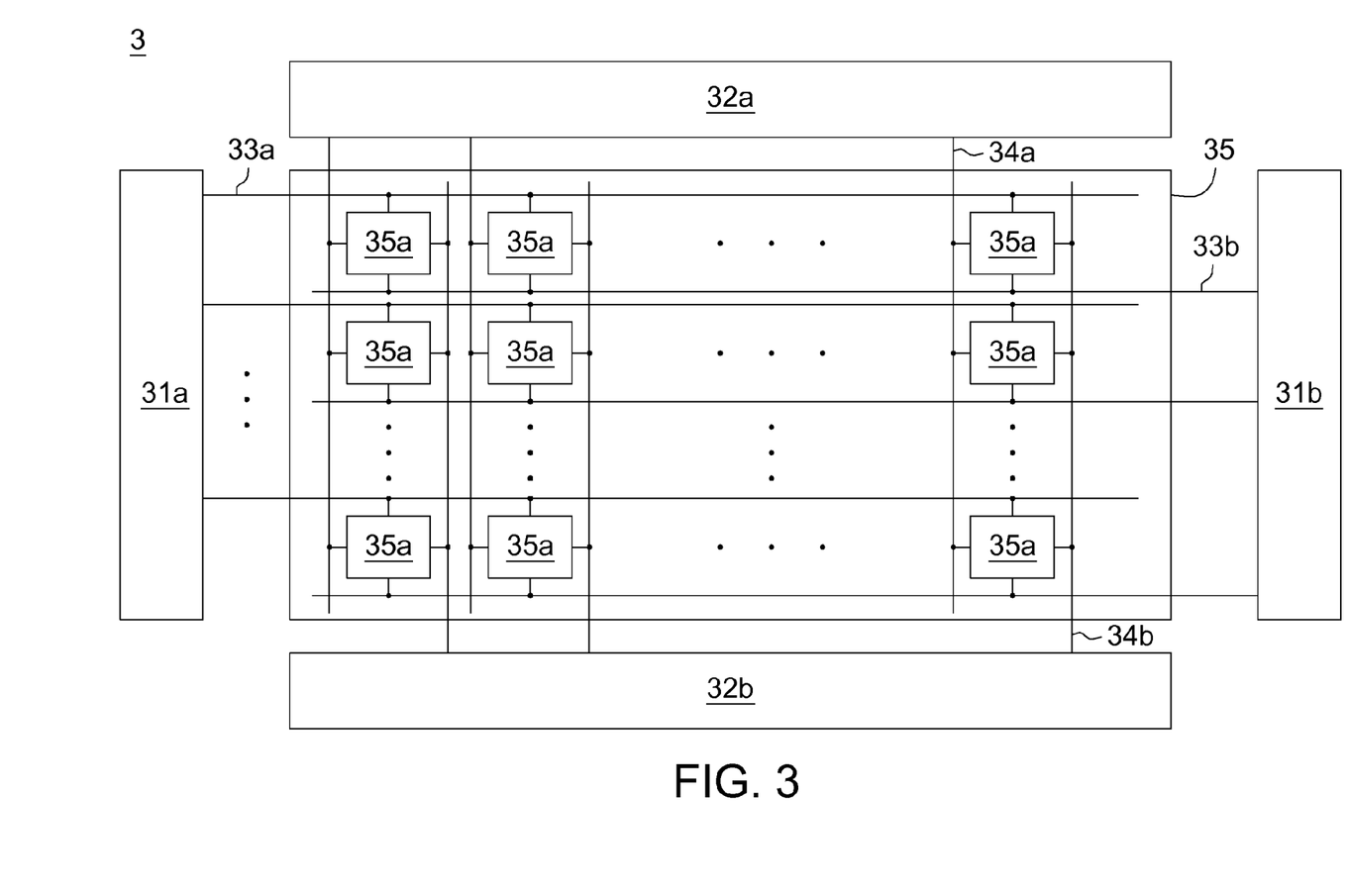
FIG. 3 shows a schematic diagram of an image sensor according to a first embodiment of the present disclosure.
Figure 4:
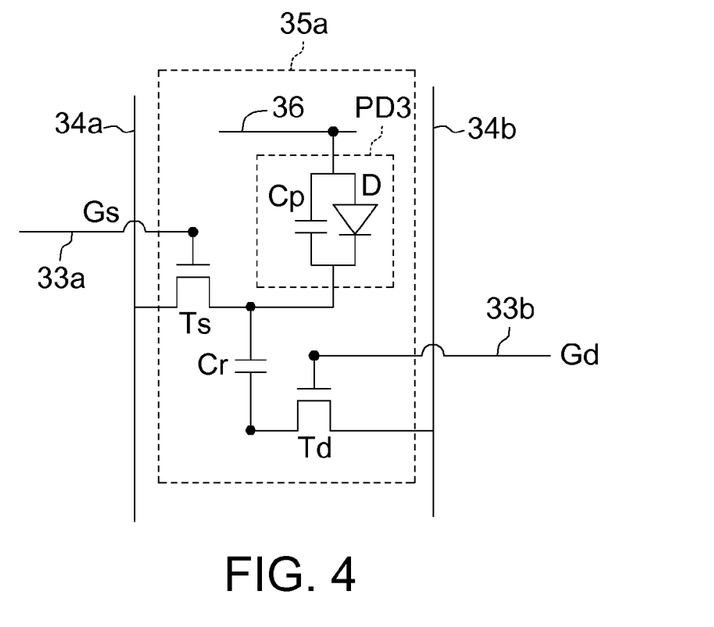
FIG. 4 shows a schematic diagram of an image sensor pixel according to a first embodiment of the present disclosure.

Referring to both FIG. 3 and FIG. 4. FIG. 3 shows a schematic diagram of an image sensor according to a first embodiment of the present disclosure. FIG. 4 shows a schematic diagram of an image sensor pixel according to a first embodiment of the present disclosure. The image sensor 3, used for sensing an X-ray, comprises a static gate driving circuit 31a, a dynamic gate driving circuit 31b, a static data driving circuit 32a, a dynamic data driving circuit 32b and an image sensing panel 35. The image sensing panel 35 comprises a static gate line 33a, a dynamic gate line 33b, a static data line 34a, a dynamic data line 34b and an image sensor pixel 35a. The static gate driving circuit 31a is for providing a static gate driving signal Gs to the static gate line 33a. The dynamic gate driving circuit 31b is for providing a dynamic gate driving signal Gd to the dynamic gate line 33b.

The image sensor pixel 35a comprises a photodiode PD3, a sensing capacitor Cr, a static transistor Ts and a dynamic transistor Td. The static transistor Ts and the dynamic transistor Td are respectively realized by such as a thin film transistor (TFT), and the control terminals of the static transistor Ts and the dynamic transistor Td are respectively realized by such as a gate. If the current flows to the second terminal of the static transistor Ts from the first terminal of the static transistor Ts, then the first terminal and the second terminal of the static transistor Ts are respectively realized by such as a drain or a source. To the contrary, if the current flows to the first terminal of the static transistor Ts from the second terminal of the static transistor Ts, then the first terminals of the static transistor Ts and the second terminal are respectively realized by such as a source or a drain.

If the current flows to the second terminal of the dynamic transistor Td from the first terminal of the dynamic transistor Td, then the first terminal and the second terminal of the dynamic transistor Td are respectively realized by such as a drain or source. To the contrary, if the current flows to the first terminal of the dynamic transistor Td from the second terminal of the dynamic transistor Td, then the first terminal and the second terminal of the dynamic transistor Td are respectively realized by such as a source or a drain.

The photodiode PD3 can be realized by such as a PIN photodiode or an MIS photodiode. For convenience of elaboration in the present embodiment below, the photodiode PD3 is exemplified by a PIN photodiode. However, the present disclosure is not limited thereto, and the photodiode PD3 can also be realized by such as an MIS photodiode. The photodiode PD3 comprises a photodiode body D and an equivalent capacitor Cp which are connected in parallel, wherein, the capacitance of the sensing capacitor Cr is smaller than that of the equivalent capacitor Cp. A control terminal of the static transistor Ts is coupled to a corresponding static gate line 33a to be controlled by a static gate driving signal Gs. A first terminal of the static transistor Ts is coupled to a terminal of the sensing capacitor Cr and a second terminal of the photodiode PD3, and a second terminal of the static transistor Ts is coupled to its corresponding static data line 34a. A control terminal of the dynamic transistor Td is coupled to a corresponding dynamic gate line 33b to be controlled by a dynamic gate driving signal Gd. A first terminal of the dynamic transistor Td is coupled to the other terminal of the sensing capacitor Cr, and a second terminal of the dynamic transistor Td is coupled to a corresponding dynamic data line 34b. A first terminal of the photodiode PD3 is coupled to a bias line 36 used for transmitting a bias voltage to the first terminal of the photodiode PD3, so that the photodiode PD3 is operated in a reverse bias state. In the first embodiment, the first terminal of the photodiode PD3 is an anode, and the second terminal of the photodiode PD3 is a cathode.

Figure 5:
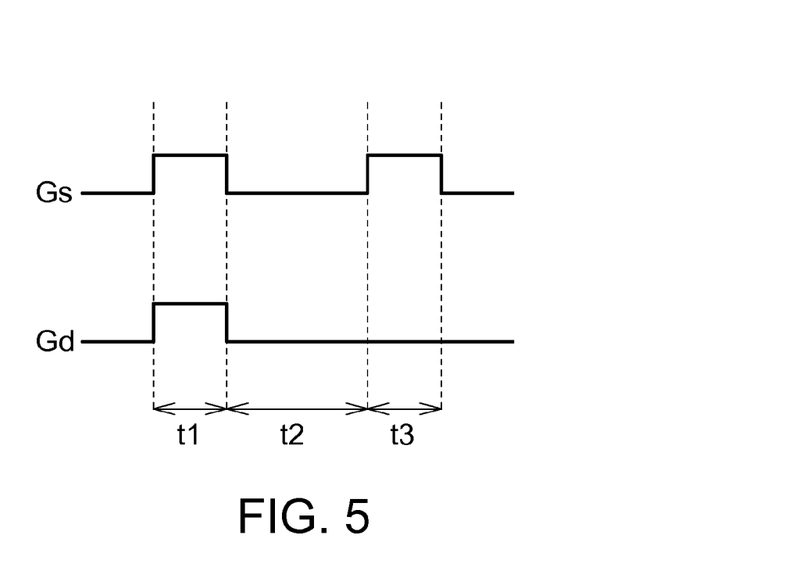
FIG. 5 shows a wave-pattern of a static gate driving signal and a dynamic gate driving signal when sensing a static object.
Figure 6:
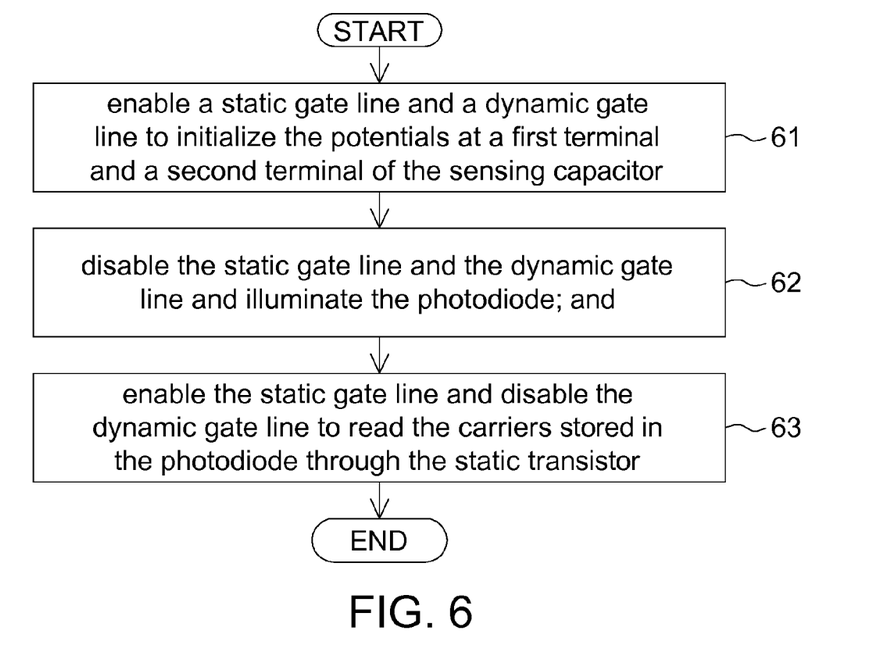
FIG. 6 shows a flowchart of a driving method for sensing a static object.
Figure 7:
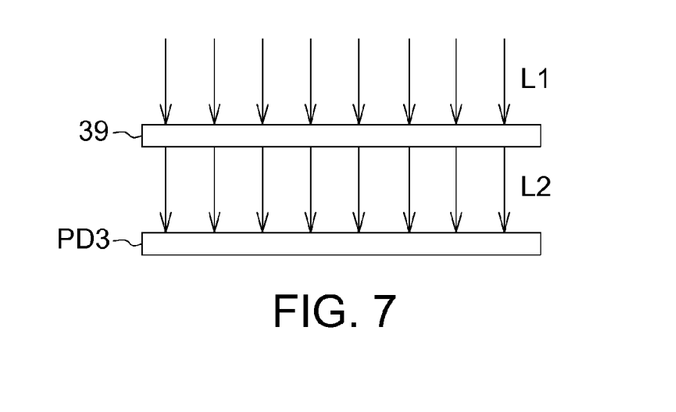
FIG. 7 shows a schematic diagram of a fluorescent layer and a photodiode.

Referring to FIGS. 5-7 at the same time. FIG. 5 shows a wave-pattern of a static gate driving signal and a dynamic gate driving signal when sensing a static object. FIG. 6 shows a flowchart of a driving method for sensing a static object. FIG. 7 shows a schematic diagram of a fluorescent layer and a photodiode. The driving method is applicable to the image sensor 3. When sensing a static object, the driving method comprises the following steps. Firstly, the method begins at step 61, the static gate line 33a and the dynamic gate line 33b are respectively enabled by the static gate driving circuit 31a and the dynamic gate driving circuit 31b to initialize the potentials at a first terminal and a second terminal of the sensing capacitor Cr in the initialization period t1.

Next, the method proceeds to step 62, the static gate line 33a and the dynamic gate line 33b are respectively disabled by the static gate driving circuit 31a and the dynamic gate driving circuit 31b and the photodiode PD3 is illuminated in the illumination period t2. Furthermore, the image sensing panel 35 can be coated with a fluorescent layer 39 formed by such as a heavy metal. The fluorescent layer 39 is for converting an X-ray L1 into a visible light L2. The visible light L2 illuminates the photodiode PD3, so that the photodiode PD3 generates electron hole pairs in the illumination period t2.

The electron holes move towards the bias line 36, and the electrons are stored in the equivalent capacitor Cp.

Then, the method proceeds to step 63, the static gate line 33a is enabled by the static gate driving circuit 31a and the dynamic gate line 33b is disabled by the dynamic gate driving circuit 31b in the read period t3, so that the electrons stored in the equivalent capacitor Cp of the photodiode PD3 are read through the static transistor Td. The electrons stored in the equivalent capacitor Cp denote an image signal, and the illumination period t2 is between the initialization period t1 and the read period t3. Since the potential at the second terminal of the sensing capacitor Cr is in a floating state in the read period t3, the sensing capacitor Cr is not considered when the static data driving circuit 32a reads the equivalent capacitor Cp. Since the equivalent capacitor Cp has a larger capacitance, a larger amount of image signal can be read.

Figure 8:
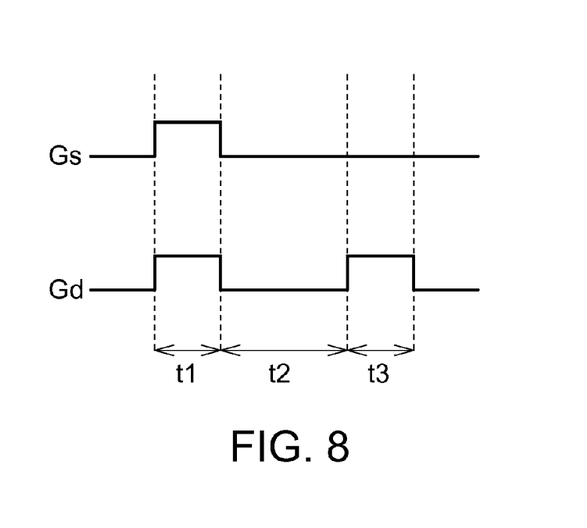
FIG. 8 shows a wave-pattern of a static gate driving signal and a dynamic gate driving signal when sensing a dynamic object.
Figure 9:
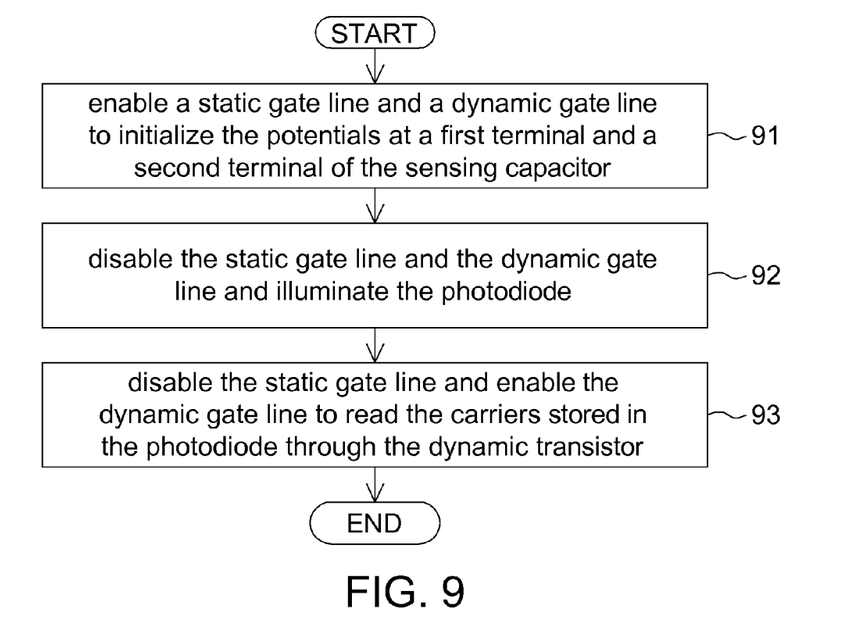
FIG. 9 shows a flowchart of a driving method for sensing a dynamic object.

Referring to both FIG. 8 and FIG. 9. FIG. 8 shows a wave-pattern of a static gate driving signal and a dynamic gate driving signal when sensing a dynamic object. FIG. 9 shows a flowchart of a driving method for sensing a dynamic object. When sensing a dynamic object, the driving method comprises the following steps. Firstly, the method begins at step 91, the static gate line 33a and the dynamic gate line 33b are respectively enabled by the static gate driving circuit 31a and the dynamic gate driving circuit 31b to initialize the potentials at a first terminal and a second terminal of the sensing capacitor Cr in the initialization period t1.

Next, the method proceeds to step 92, the static gate line 33a and the dynamic gate line 33b are respectively disabled by the static gate driving circuit 31a and the dynamic gate driving circuit 31b and the photodiode PD3 is illuminated in the illumination period t2. Furthermore, the image sensing panel 35 can be coated with a fluorescent layer 39 formed by such as a heavy metal. The fluorescent layer 39 is for converting an X-ray L1 into a visible light L2. The visible light L2 illuminates the photodiode PD3, so that the photodiode PD3 generates electron hole pairs in the illumination period t2. The electron holes move towards the bias line 36, and the electrons will be stored in the equivalent capacitor Cp.

Then, the method proceeds to step 93, the static gate line 33a is disabled by the static gate driving circuit and the dynamic gate line 33b is enabled by the dynamic gate driving circuit 31b, so that the signals stored in the equivalent capacitor Cp of the photodiode PD3 are read through the dynamic transistor Td and the sensing capacitor Cr. Since the sensing capacitor Cr is serially connected to the equivalent capacitor Cp of the photodiode PD3 when sensing a dynamic object, the entire capacitance drops due to the serial connection between the sensing capacitor Cr and the equivalent capacitor Cp. Therefore, when reading the signal, the read speed of the image sensor 3 increases due to the drop in the entire capacitance.

Figure 10:
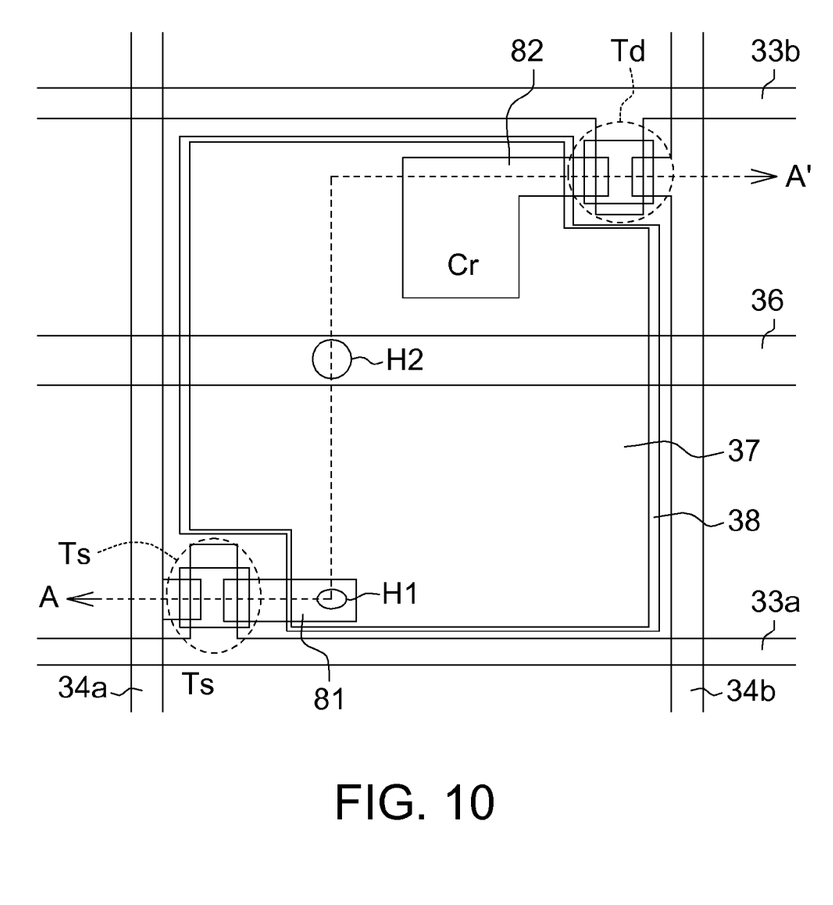
FIG. 10 shows a circuit layout diagram of an image sensor pixel according to a first embodiment of the present disclosure.
Figure 11:
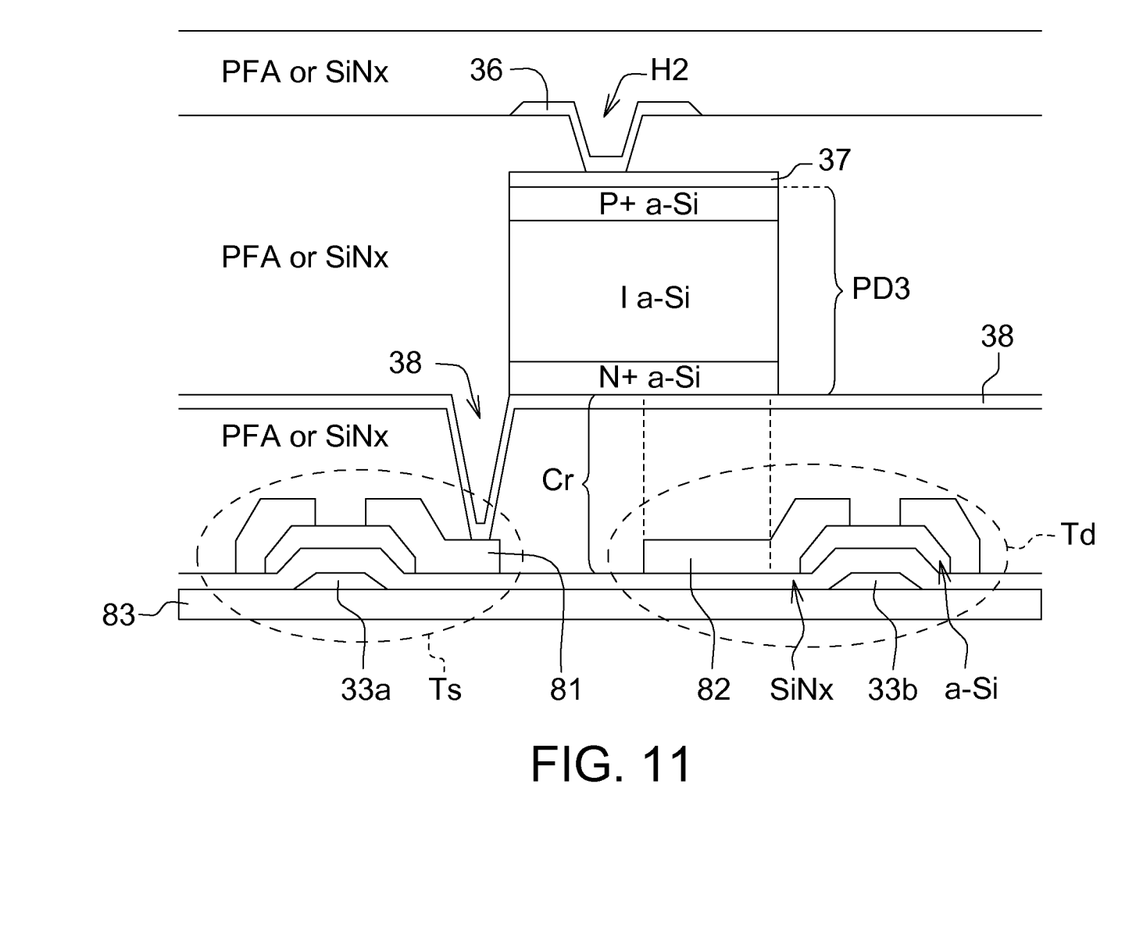
FIG. 11 shows a cross-sectional view along a cross-sectional line AA'.

Referring to both FIG. 10 and FIG. 11. FIG. 10 shows a circuit layout diagram of an image sensor pixel according to a first embodiment of the present disclosure. FIG. 11 shows a cross-sectional view along a cross-sectional line AA'. The static gate line 33a and the dynamic gate line 33b are formed in a substrate 83. A first terminal 81 of the static transistor Ts is electrically connected to the metal layer 38 through the contact hole H1, and the bias line 36 is electrically connected to the transparent electrode 37 through the contact hole H2. The transparent electrode 37 is connected to the P+ type amorphous silicon of the photodiode PD3, and the N+ type amorphous silicon of the photodiode PD3 is connected to the metal layer 38. The intrinsic amorphous silicon is interposed between the N+ type amorphous silicon and the P+ type amorphous silicon. The sensing capacitor Cr is formed at the overlapping between a part of the metal layer 38 and the first terminal of the dynamic transistor Td.

Second Embodiment

Figure 12:
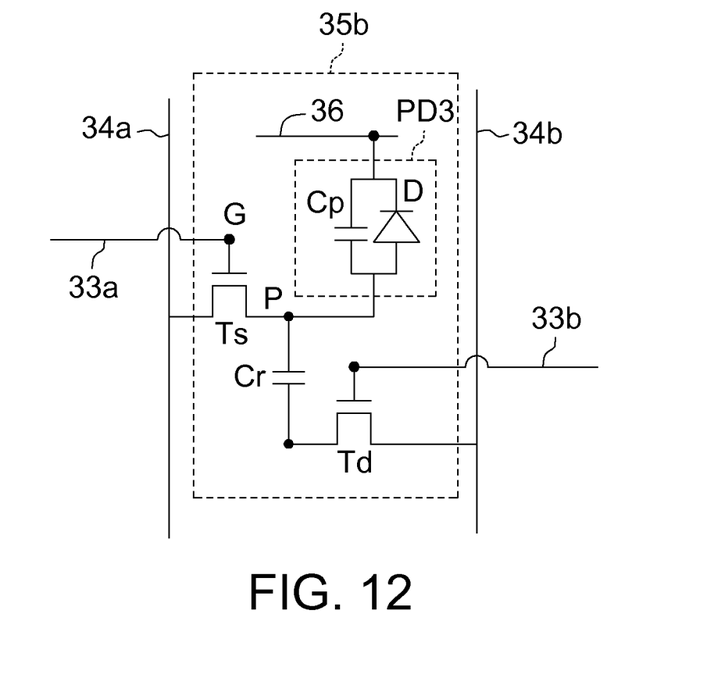
FIG. 12 shows a schematic diagram of an image sensor pixel according to a second embodiment of the present disclosure.

Referring to FIG. 12, a schematic diagram of an image sensor pixel according to a second embodiment of the present disclosure is shown. The image sensor pixel 35b is different from the image sensor pixel 35a mainly in that: in the second embodiment, the first terminal of the photodiode PD3 is a cathode, and the second terminal of the photodiode PD3 is an anode. That is, the cathode of the photodiode PD3 of the image sensor pixel 35b is coupled to the bias line 36, and the anode of the photodiode is coupled to a terminal of the sensing capacitor Cr.

Third Embodiment

Figure 13:
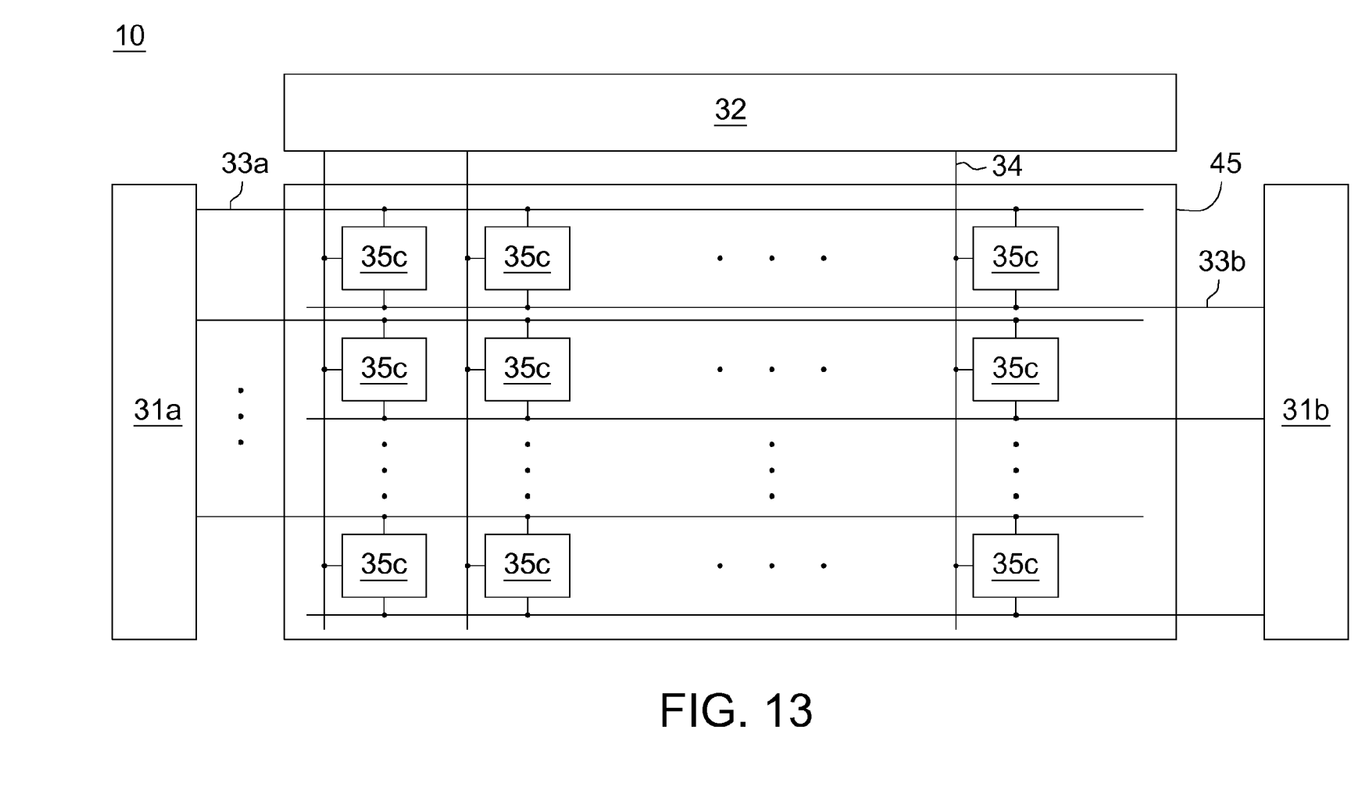
FIG. 13 shows a schematic diagram of an image sensor pixel according to a third embodiment of the present disclosure.
Figure 14:
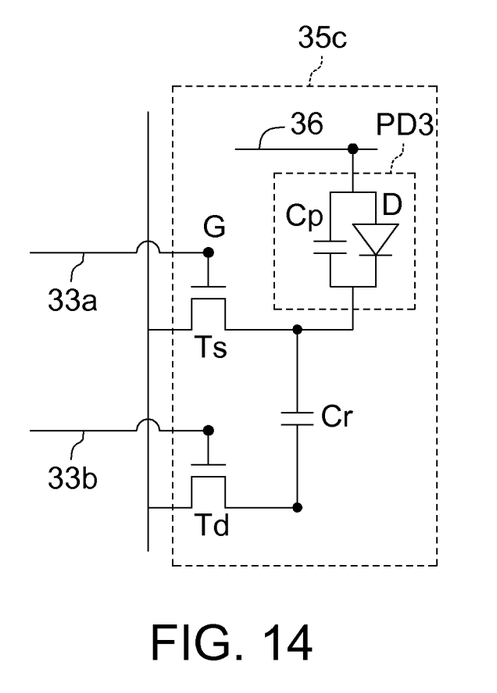
FIG. 14 shows a schematic diagram of an image sensor pixel according to a third embodiment of the present disclosure.

Referring to both FIG. 13 and FIG. 14. FIG. 13 shows a schematic diagram of an image sensor pixel according to a third embodiment of the present disclosure. FIG. 14 shows a schematic diagram of an image sensor pixel according to a third embodiment of the present disclosure. The image sensor 10 is different from the image sensor 3 mainly in that: in the image sensor 10, the static data driving circuit 32a and the dynamic data driving circuit 32b are replaced by the data driving circuit 32; the static data line 34a and the dynamic data line 34b are replaced by the data line 34; the image sensing panel 35 is replaced by the image sensing panel 45; the image sensor pixel 35a is replaced by the image sensor pixel 35c. The image sensor pixel 35c is different from the image sensor pixel 35a mainly in that second terminals of the static transistor Ts and the dynamic transistor Td are both coupled to a corresponding data line 34, so that the numbers of the data lines and the data driving circuits can both be reduced.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An image sensor pixel, comprising:
  a photodiode, wherein a first terminal of the photodiode is coupled to a bias line;
  a sensing capacitor;
  a static transistor, wherein a control terminal of the static transistor is coupled to a static gate line, and a first terminal of the static transistor is coupled to a first terminal of the sensing capacitor and a second terminal of the photodiode; and
  a dynamic transistor, wherein a control terminal of the dynamic transistor is coupled to a dynamic gate line, and a first terminal of the dynamic transistor is coupled to a second terminal of the sensing capacitor.

2. The image sensor pixel according to claim 1, wherein a second terminal of the static transistor is coupled to a static data line, and a second terminal of the dynamic transistor is coupled to a dynamic data line.

3. The image sensor pixel according to claim 1, wherein a second terminal of the static transistor and a second terminal of the dynamic transistor are coupled to a data line.

4. The image sensor pixel according to claim 1, wherein the first terminal of the photodiode is an anode, and the second terminal of the photodiode is a cathode.

5. The image sensor pixel according to claim 1, wherein the first terminal of the photodiode is a cathode, and the second terminal of the photodiode is an anode.

6. The image sensor pixel according to claim 1, wherein when sensing a static object, the static transistor and the dynamic transistor are enabled in an initialization period, the static transistor and the dynamic transistor are disabled in an initialization period, the static transistor and the dynamic transistor are respectively enabled and disabled in a read period, and the illumination period is between the initialization period and the read period.

7. The image sensor pixel according to claim 1, wherein when sensing a dynamic object, the static transistor and the dynamic transistor are enabled in an initialization period, the static transistor and the dynamic transistor are disabled in an initialization period, the static transistor and the dynamic transistor are respectively disabled and enabled in a read period, and the illumination period is between the initialization period and the read period.

8. The image sensor pixel according to claim 1, wherein the sensing capacitor is smaller than an equivalent capacitance of the photodiode.

9. The image sensor pixel according to claim 1, wherein the photodiode is a PIN photodiode.

10. The image sensor pixel according to claim 1, wherein the photodiode is an MIS photodiode.

11. A driving method of image sensor pixel, wherein the image sensor pixel comprises a photodiode, a sensing capacitor, a static transistor and a dynamic transistor, and the driving method comprises:
enabling a static gate line and a dynamic gate line to initialize the potentials at a first terminal and a second terminal of the sensing capacitor, wherein the static gate line is coupled to a control terminal of the static transistor, the dynamic gate line is coupled to a control terminal of the dynamic transistor, a first terminal of the photodiode is coupled to a bias line, a first terminal of the static transistor is coupled to a first terminal of the sensing capacitor and a second terminal of the photodiode, and a first terminal of the dynamic transistor is coupled to a second terminal of the sensing capacitor;
disabling the static gate line and the dynamic gate line and illuminating the photodiode; and
disabling the static gate line and enabling the dynamic gate line to read the photodiode through the dynamic transistor and the sensing capacitor.

12. The driving method according to claim 11, comprising:
enabling the static gate line and disabling the dynamic gate line to read the photodiode through the static transistor.

13. The driving method according to claim 11, wherein a second terminal of the static transistor is coupled to a static data line, and a second terminal of the dynamic transistor is coupled to a dynamic data line.

14. The driving method according to claim 11, wherein the second terminal of the static transistor and the second terminal of the dynamic transistor are coupled to a data line.

15. The driving method according to claim 11, wherein the first terminal of the photodiode is an anode, and the second terminal of the photodiode is a cathode.

16. The driving method according to claim 11, wherein the first terminal of the photodiode is a cathode, the second terminal of the photodiode is an anode.

17. The driving method according to claim 11, wherein the sensing capacitance is smaller than an equivalent capacitance of the photodiode.

18. The driving method according to claim 11, wherein the photodiode is a PIN photodiode.

19. The driving method according to claim 11, wherein the photodiode is an MIS photodiode.

* * * * *